US012642078B2

(12) United States Patent
Kang et al.

(10) Patent No.: US 12,642,078 B2
(45) Date of Patent: May 26, 2026

(54) POWER DISTRIBUTION NETWORK AND SEMICONDUCTOR DEVICE

(71) Applicant: SK hynix Inc., Icheon-si (KR)

(72) Inventors: Ki Bum Kang, Icheon-si (KR); Myeong Jin Kim, Icheon-si (KR); Jin Hyun Kim, Icheon-si (KR); Yun Ra, Icheon-si (KR); Gyu Sun Park, Icheon-si (KR); Sei Hyung Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 531 days.

(21) Appl. No.: 18/146,408

(22) Filed: Dec. 26, 2022

(65) Prior Publication Data

US 2024/0105616 A1     Mar. 28, 2024

(30) Foreign Application Priority Data

Sep. 28, 2022     (KR) ........................ 10-2022-0123146

(51) Int. Cl.
| | |
|---|---|
| *H10W 20/41* | (2026.01) |
| *H10W 70/65* | (2026.01) |
| *H10W 70/654* | (2026.01) |
| *H10W 72/00* | (2026.01) |
| *H10W 72/29* | (2026.01) |
| *H10W 72/59* | (2026.01) |
| *H10W 74/15* | (2026.01) |
| *H10W 90/00* | (2026.01) |

(52) U.S. Cl.
CPC .......... *H10W 20/427* (2026.01); *H10W 70/65* (2026.01); *H10W 70/654* (2026.01); *H10W 72/07554* (2026.01); *H10W 72/29* (2026.01);

*H10W 72/59* (2026.01); *H10W 72/884* (2026.01); *H10W 74/15* (2026.01); *H10W 90/724* (2026.01); *H10W 90/734* (2026.01); *H10W 90/754* (2026.01)

(58) Field of Classification Search
None
See application file for complete search history.

(56) References Cited

U.S. PATENT DOCUMENTS

| | | | | |
|---|---|---|---|---|
| 5,789,807 A | * | 8/1998 | Correale, Jr. ....... | H01L 23/5286 257/691 |
| 6,653,726 B1 | * | 11/2003 | Schultz ............... | H01L 23/5286 257/691 |

(Continued)

FOREIGN PATENT DOCUMENTS

| | | |
|---|---|---|
| KR | 10-2011-0004280 A | 1/2011 |
| KR | 10-2020-0135151 A | 12/2020 |

*Primary Examiner* — Cory W Eskridge

(57)     ABSTRACT

Various embodiments generally relate to a power distribution network and a semiconductor device, which may include: a plurality of chip pads; a first distribution layer in which a plurality of first conductive lines having rectangular shapes of different sizes, respectively, are disposed; a second distribution layer in which a plurality of second conductive lines including a central cross-shaped conductive line and L-shaped conductive lines open toward respective corners of the second distribution layer are disposed; and a redistribution layer electrically coupling chip pads to which power is applied among the plurality of chip pads and the first conductive lines of the first distribution layer.

7 Claims, 10 Drawing Sheets

(56)     References Cited

U.S. PATENT DOCUMENTS

| 6,747,349 | B1 * | 6/2004 | Al-Dabagh | H01L 23/5286 |
| | | | | 257/691 |
| 7,602,058 | B2 * | 10/2009 | Katou | H01L 23/5286 |
| | | | | 257/E23.079 |
| 10,840,227 | B2 | 11/2020 | Huang et al. | |
| 2019/0122986 | A1 * | 4/2019 | Yang | H01L 23/5286 |
| 2019/0131287 | A1 | 5/2019 | Huang et al. | |

* cited by examiner

POWER DISTRIBUTION NETWORK AND SEMICONDUCTOR DEVICE

CROSS-REFERENCE TO RELATED APPLICATION

The present application claims priority under 35 U.S.C. § 119(a) to Korean Patent Application No. 10-2022-0123146 filed in the Korean Intellectual Property Office on Sep. 28, 2022, which is incorporated herein by reference in its entirety.

BACKGROUND

1. Technical Field

Various embodiments generally relate to a power distribution network and a semiconductor device.

2. Related Art

Throughout the semiconductor electronics industry, research and development are being conducted in the aspects of performance, size, power and cost characteristics. As the switching speed, that is, an operating speed of semiconductor integrated circuits, increases, a method for reducing loss due to power consumption is required. As measure for achieving low power consumption, in addition to a method for reducing current consumption, it is necessary to improve an on-chip power distribution network.

SUMMARY

Various embodiments are directed to a power distribution network that forms a right angle to a routing direction of power, and a semiconductor device.

Also, various embodiments are directed to a power distribution network with improved flexibility of via formation, and a semiconductor device.

In an embodiment, a semiconductor device may include: a plurality of chip pads to which voltage is applied; a first distribution layer in which a plurality of first conductive lines, each arranged as a rectangular frame of a different size, are disposed; a second distribution layer in which a plurality of second conductive lines including a central cross-shaped conductive line and L-shaped conductive lines open toward respective corners of the second distribution layer are disposed; and a redistribution layer electrically coupling the plurality of chip pads and the first conductive lines of the first distribution layer.

In an embodiment, a power distribution network may include: a plurality of first conductive lines disposed in a first layer, and having rectangular shapes of different sizes, respectively; and a plurality of second conductive lines disposed in a second layer different from the first layer, and including a central cross-shaped conductive line and L-shaped conductive lines open toward respective corners of the second layer.

According to the embodiments of the disclosed technology, it is possible to improve the electrical characteristics of an on-chip power distribution network.

DETAILED DESCRIPTION

Hereinafter, embodiments of the present disclosure will be described in detail with reference to the accompanying drawings.

Figure 1:
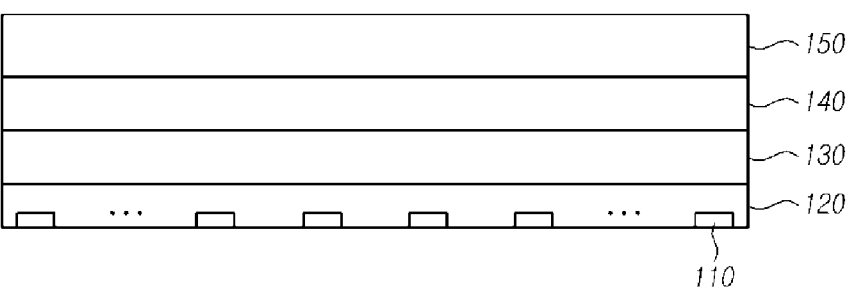
FIG. 1 is a schematic cross-sectional view of a semiconductor device according to an embodiment of the disclosure.

FIG. 1 is a schematic cross-sectional view of a semiconductor device according to an embodiment of the disclosure.

Referring to FIG. 1, a semiconductor device 100 may include chip pads 110, a redistribution layer 120, a metal part 130, an element layer 140 and a substrate 150.

The semiconductor device 100 includes an integrated circuit (IC), in which a plurality of elements are disposed, on the substrate 150. The integrated circuit may be implemented as various devices such as for example a microcontroller, an SRAM, a DRAM, a nonvolatile memory and a system-on-chip (SoC). The semiconductor device 100 may be bonded to a package substrate using various methods such as a flip chip bonding method and a wire bonding method. The semiconductor device 100 may include a power distribution network (PDN) to supply power to respective elements of the integrated circuit. The power distribution network may include a plurality of layers in which conductive lines are disposed. The power distribution network (PDN) transfers a ground reference voltage (VSS) and a power supply reference voltage (VDD), applied from the outside, through the plurality of layers to each element to drive the integrated circuit.

The chip pads 110 may transfer power, applied from the outside, to the semiconductor device 100. As described above, the semiconductor device 100 may be bonded to the package substrate by a flip-chip bonding method, for example. The chip pads 110 electrically couple the semiconductor device 100 and the package substrate, and transfer power and signals between them. The plurality of chip pads 110 may be disposed on the semiconductor device 100 in various ways, and may be arranged in a matrix format. Chip pads 110 that are disposed relatively centrally on a plane may be chip pads that transfer power for driving the integrated circuit. Chip pads 110 that are disposed relatively peripherally may be chip pads that transfer signals for driving the integrated circuit.

The redistribution layer 120 electrically couples the chip pads 110 and a semiconductor chip. Power or signals that are transferred through the chip pads 110 are provided to the semiconductor chip through a conductive pattern or conductive lines that are disposed in the redistribution layer 120. The redistribution layer 120 may include one or more ground reference voltage lines that are electrically coupled to the chip pads 110, to which the ground reference voltage is applied from among the plurality of chip pads 110. Also, the redistribution layer 120 may include one or more power supply reference voltage lines that are electrically coupled to the chip pads 110, to which the power supply reference voltage is applied among the plurality of chip pads 110.

The metal part 130 may include a plurality of distribution layers, and each distribution layer may include a plurality of conductive lines. A first distribution layer in the metal part 130 is a distribution layer that is disposed closest to the redistribution layer 120, and a second distribution layer in the metal part 130 is a distribution layer which is adjacent to the first distribution layer. The conductive lines that are included in the plurality of distribution layers may be disposed in a structure that is advantageous to provide power to the elements included in the integrated circuit. The conductive lines may be formed of any suitable conductive material including a metal. The conductive lines of distribution layers that are adjacent to each other may be coupled through vias. The ground reference voltage and the power supply reference voltage may be applied to the conductive lines of the first distribution layer through the chip pads 110 and the ground reference voltage lines and the power supply reference voltage lines of the redistribution layer 120, and may be applied to the conductive lines of the second distribution layer through vias. The metal part 130 may transfer the ground reference voltage and the power supply reference voltage to the element layer 140.

The element layer 140 is a layer in which elements necessary for driving the integrated circuit are disposed. The element layer 140 may include elements such as transistors for the operation of the semiconductor device 100. The substrate 150 may be a silicon substrate that is doped with a p-type dopant such as boron or an n-type dopant such as phosphorus or arsenic. The element layer 140 and the metal part 130 may be formed on the substrate 150.

As described above, power may be applied to the redistribution layer 120 from the chip pads 110 that are disposed relatively centrally on a plane. The redistribution layer 120 may route power to the first distribution layer of the metal part 130. In an example, if the first distribution layer of the metal part 130 includes stripe type conductive lines, and if a conductive pattern or conductive lines for routing power in the redistribution layer 120 form a right angle to the stripe type conductive lines of the first distribution layer of the metal part 130, then vias may be formed relatively easily. However, where a conductive pattern or conductive lines for routing power in the redistribution layer 120 and the conductive lines of the first distribution layer of the metal part 130 are parallel and thus oriented in the same direction, then this configuration serves as a limitation in the formation of vias. The power applied to conductive lines, which are limited in the formation of vias, of the first distribution layer of the metal part 130 may bypass the vias and may be redistributed through the conductive lines of the second distribution layer of the metal part 130. Due to the limited number of vias, power distribution through bypass paths increases resistance in components, leading to deterioration in the power distribution characteristics of the semiconductor device 100 and limitations in the implementation of low power consumption of the semiconductor device 100.

Hereinafter, the first distribution layer and the second distribution layer of the metal part 130, which improve the power distribution characteristics of the semiconductor device 100, will be described.

Figure 2:
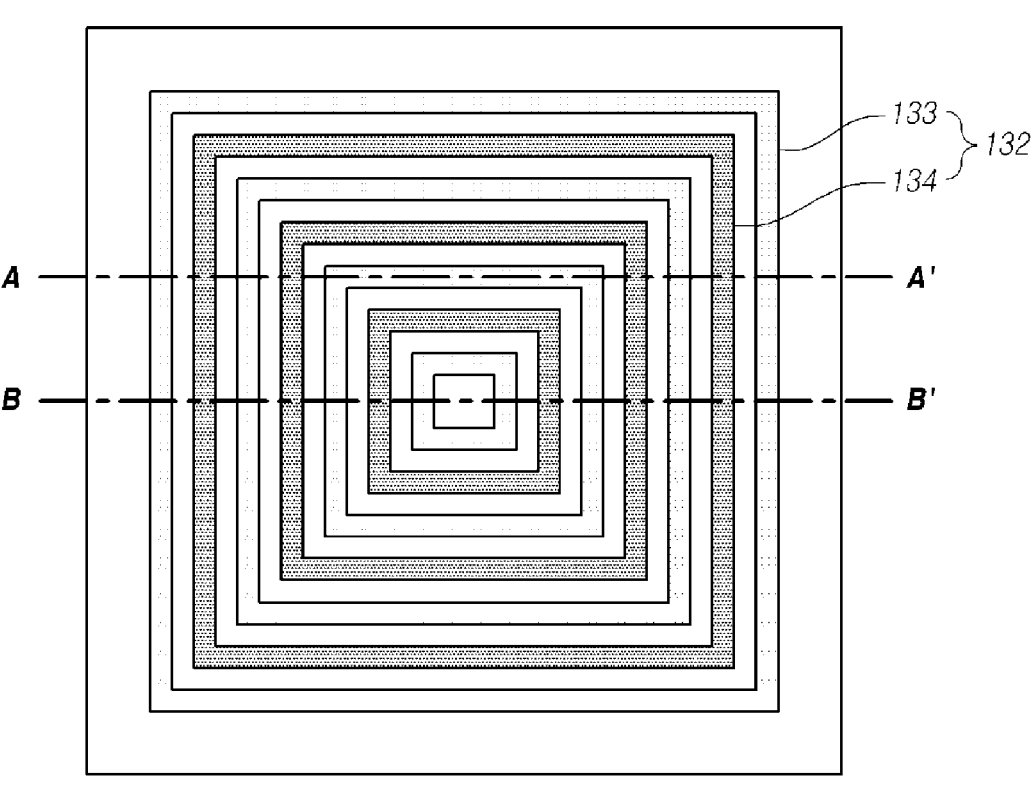
FIG. 2 is a plan view illustrating first conductive lines according to an embodiment of the disclosure.

FIG. 2 is a plan view illustrating first conductive lines according to an embodiment of the disclosure.

Referring to FIG. 2, a plurality of first conductive lines 132 of rectangular, frame-like shapes of different sizes may be disposed in a first distribution layer 131.

Among the plurality of distribution layers that are included in the metal part 130, the first distribution layer 131 is a distribution layer to which power is applied through vias from the redistribution layer 120. The first conductive lines 132 that are disposed in the first distribution layer 131 may have rectangular frame shapes, and may be structured in such a manner that a relatively small-sized frame is surrounded by a relatively large-sized frame. The rectangular pattern of the first distribution layer 131 may be a pattern that includes consecutive, non-overlapping rectangular frames with the same center. A dielectric material or layer may be disposed between adjacent first conductive lines 132 for insulation.

The first conductive lines 132 may be divided into first VSS lines 133, which are electrically coupled with the ground reference voltage lines of the redistribution layer 120 through vias, and first VDD lines 134, which are electrically coupled with the power supply reference voltage lines of the redistribution layer 120 through vias.

Ground reference voltage lines disposed in the redistribution layer 120 may apply ground reference voltage to the first VSS lines 133. The first VSS lines 133 may provide the ground reference voltage to conductive lines disposed in another distribution layer. Power supply reference voltage lines disposed in the redistribution layer 120 may apply power supply reference voltage to the first VDD lines 134. The first VDD lines 134 may provide the power supply reference voltage to conductive lines included in another distribution layer.

The first VSS lines 133 and the first VDD lines 134 may be alternately disposed. For example, in the first distribution layer 131, a first VSS line 133 may be disposed to surround a first VDD line 134, which may be disposed to surround another first VSS line 133, which may be disposed to surround another first VDD line 134, and so on.

In contrast to embodiments of the present disclosure, when the first conductive lines 132 included in the first distribution layer 131 are a stripe type, direct coupling through vias to the ground reference voltage lines or the power supply reference voltage lines of the redistribution layer 120 is limited because the direct coupling must take place in a specific region. For example, direct coupling can only be achieved in a region where the first conductive lines 132 are disposed in the same direction as, or a parallel direction to, the ground reference voltage lines or the power supply reference voltage lines of the redistribution layer 120. Accordingly, power may be applied to the first conductive lines 132 through paths bypassing the second distribution layer. In embodiments of the present disclosure, however, as described above and illustrated in FIG. 2, the first conductive lines 132 disposed in the first distribution layer 131 are arranged as rectangular frame shapes of different sizes. The rectangular frame conductive lines are also arranged consecutively so that a relatively small-sized rectangular frame is surrounded by a relatively large-sized rectangular frame. The ground reference voltage lines or the power supply reference voltage lines, which are disposed in the redistribution layer 120, are more likely to cross the first conductive lines 132 at right angles, from a plan view. Accordingly, flexibility of via formation with the shortest distance between the first conductive lines 132 and the voltage lines is increased because there are more possible intersections between the lines in a plan view. Through this, a phenomenon in which power is supplied through unnecessary bypass paths may be solved, and power distribution characteristics may be improved.

Figure 3:
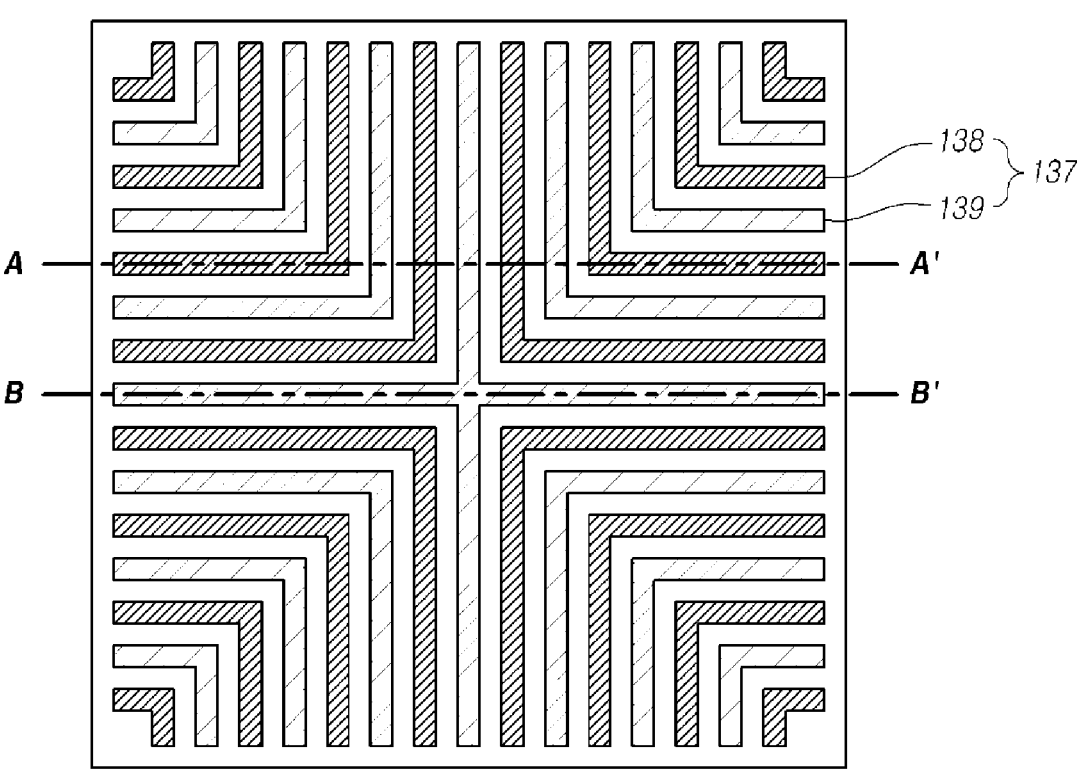
FIG. 3 is a plan view illustrating second conductive lines according to an embodiment of the disclosure.

FIG. 3 is a plan view illustrating second conductive lines according to an embodiment of the disclosure.

Referring to FIG. 3, in a second distribution layer 136 of a metal part 130, a plurality of second conductive lines 137, including a central cross-shaped conductive line dividing the layer into quadrants, and L-shaped conductive lines that are open toward the respective corners of the second distribution layer 136, may be disposed. The L-shaped conductive lines may be arranged as chevrons having an apex pointing toward the center of the cross-shaped conductive line.

Among the plurality of distribution layers included in the metal part 130, the second distribution layer 136 is a distribution layer to which power is applied through vias from the first distribution layer 131. The second conductive lines 137, which are disposed in the second distribution layer 136, may include the L-shaped conductive lines, which are open toward the respective corners of the second distribution layer 136. Also, the second conductive lines 137 may include the cross-shaped conductive line, which is centrally disposed in the second distribution layer 136.

The first conductive lines 132 disposed in the first distribution layer 131 and the second conductive lines 137 disposed in the second distribution layer 136 of the metal part 130 may form right angles to each other and may intersect in a plan view. The cross-shaped conductive line, which is centrally disposed in the second distribution layer 136, and the L-shaped conductive lines, which are open toward the respective corners of the second distribution layer 136, may form right angles to the first conductive lines 132, and vias may be formed between the first conductive lines 132 and the second conductive lines 137. The vias may extend along the shortest path between the first conductive lines 132 and the second conductive lines 137.

The second conductive lines 137 may be divided into second VSS lines 138, which are coupled to the first VSS lines 133 through vias, and second VDD lines 139, which are coupled to the first VDD lines 134 through vias. The second VSS lines 138 are conductive lines to which the ground reference voltage is applied through the ground reference voltage lines of the redistribution layer 120 and the first VSS lines 133 from the chip pads 110, to which the ground reference voltage is applied. The second VDD lines 139 are conductive lines to which the power supply reference voltage is applied through the power supply reference voltage lines of the redistribution layer 120 and the first VDD lines 134 from the chip pads 110, to which the power supply reference voltage is applied. The second conductive lines 137 may transfer power to a distribution layer or the element layer 140, which is adjacent to the second distribution layer 136 of the metal part 130.

The second VSS lines 138 and the second VDD lines 139 may be alternately disposed with each other. A conductive line that is adjacent to a second VSS line 138 may be a second VDD line 139, which is adjacent to another second VSS line 138, which in turn is be adjacent to another corresponding second VDD line 139, and so on.

The disposition of the first VSS lines 133, the first VDD lines 134, the second VSS lines 138 and the second VDD lines 139 illustrated in FIGS. 2 and 3 represents only one example. The widths, ratios, numbers, etc. of conductive lines may be changed in a variety of ways.

Figure 4:
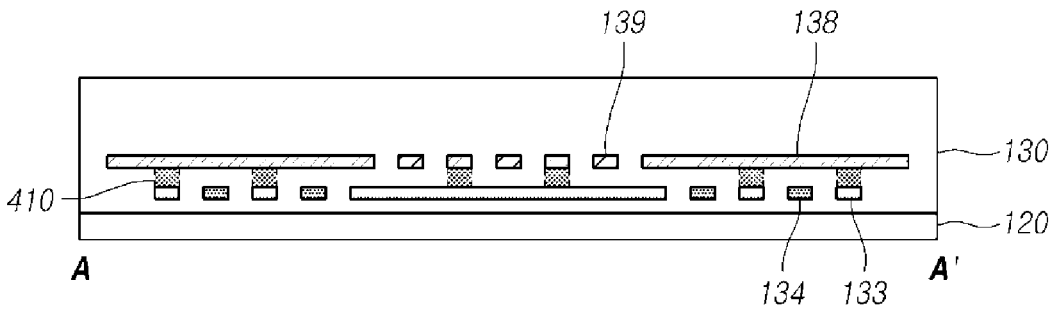
FIG. 4 is a view illustrating cross-sections A-A' and B-B' of a first distribution layer and a second distribution layer in FIGS. 2 and 3.
Figure 4:
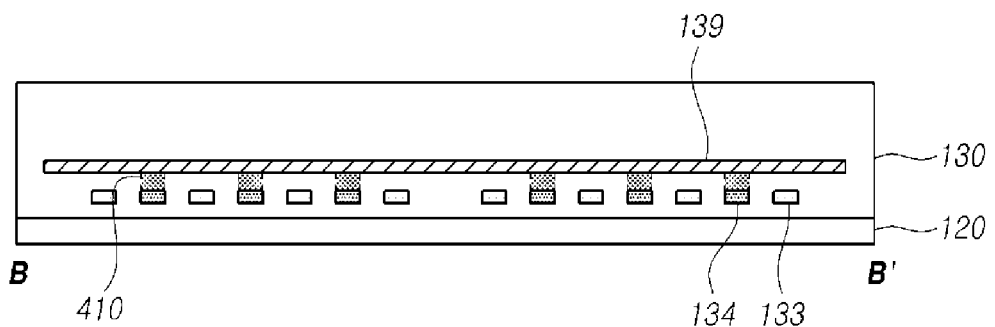

FIG. 4 is a view illustrating cross-sections A-A' and B-B' of a first distribution layer and a second distribution layer in FIGS. 2 and 3.

Referring to FIG. 4, the first conductive lines 132 that are included in the first distribution layer 131 and the second conductive lines 137 that are included in the second distribution layer 136 may be coupled through first vias 410.

A dielectric may be disposed between the first conductive lines 132 and the second conductive lines 137 to maintain insulation between the first conductive lines 132 and the second conductive lines 137.

FIG. 4 illustrates intersections in a first direction (e.g., a vertical direction) of the first VSS lines 133 and the second VSS lines 138 in the cross-section A-A'. First vias 410 may be formed at all or some of the intersections between the first VSS lines 133 and the second VSS lines 138. Alternatively, in other embodiments, the first vias 410 may not be formed at the intersections on the cross-section A-A', but may be formed at different positions.

FIG. 4 also illustrates intersections in the first direction of the first VDD lines 134 and the second VDD lines 139 in the cross-section B-B'. As described above for the cross-section A-A', first vias 410 may be formed at all or some of the intersections of the first VDD lines 134 and the second VDD lines 139. Alternatively, in other embodiments, is the first vias 410 may not be formed at the intersections of the first VDD lines 134 and the second VDD lines 139 on the cross-section B-B', but may be formed at different positions.

The positions of the first vias 410 that are formed between the first conductive lines 132 and the second conductive lines 137 may be determined depending on the design of an integrated circuit. Positions where the first vias 410 are formed may be flexibly determined due to the structure of the conductive lines illustrated in FIGS. 2 and 3.

Figure 5:
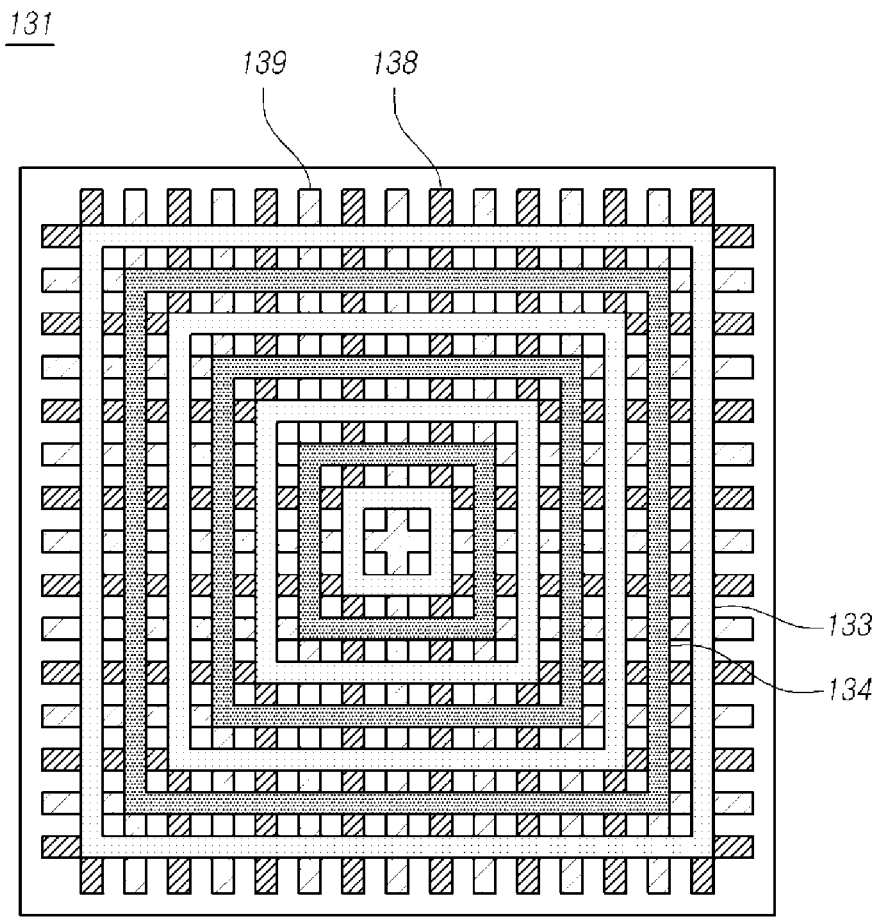
FIG. 5 is a plan view illustrating the first conductive lines and the second conductive lines according to the embodiments of the disclosure.

FIG. 5 is a plan view illustrating first conductive lines and the second conductive lines according to the embodiments of the disclosure.

Referring to FIG. 5, viewed in the first direction from the first distribution layer 131, the first conductive lines 132 and the second conductive lines 137 may form right angles with each other at multiple intersections.

The power distribution network of the semiconductor device 100 may have a grid structure in which the first VSS lines 133 and the first VDD lines 134 included in the first distribution layer 131 and the second VSS lines 138 and the second VDD lines 139 included in the second distribution layer 136 overlap each other in the first direction.

The grid structure of the power distribution network may be implemented in various ways. As illustrated in FIG. 5, a rectangular conductive line that is disposed innermost, or closest to the center, from among the first conductive lines 132 may be a first VSS line 133. In other embodiments, unlike the structures illustrated in FIG. 5, a rectangular conductive line that is disposed innermost, or closest to the center, from among the first conductive lines 132 may be a first VDD line 134. In the above examples, the first VSS lines 133 and the first VDD lines 134 may be alternately and repeatedly disposed.

Similarly, as illustrated in FIG. 5, the cross-shaped second conductive line 137 that is centrally disposed may be a second VDD line 139. In other embodiments, unlike the illustration of FIG. 5, the cross-shaped second conductive line 137 that is centrally disposed may be a second VSS line 138. In the above examples, the second VSS lines 138 and the second VDD lines 139 may be alternately and repeatedly disposed.

Figure 6:
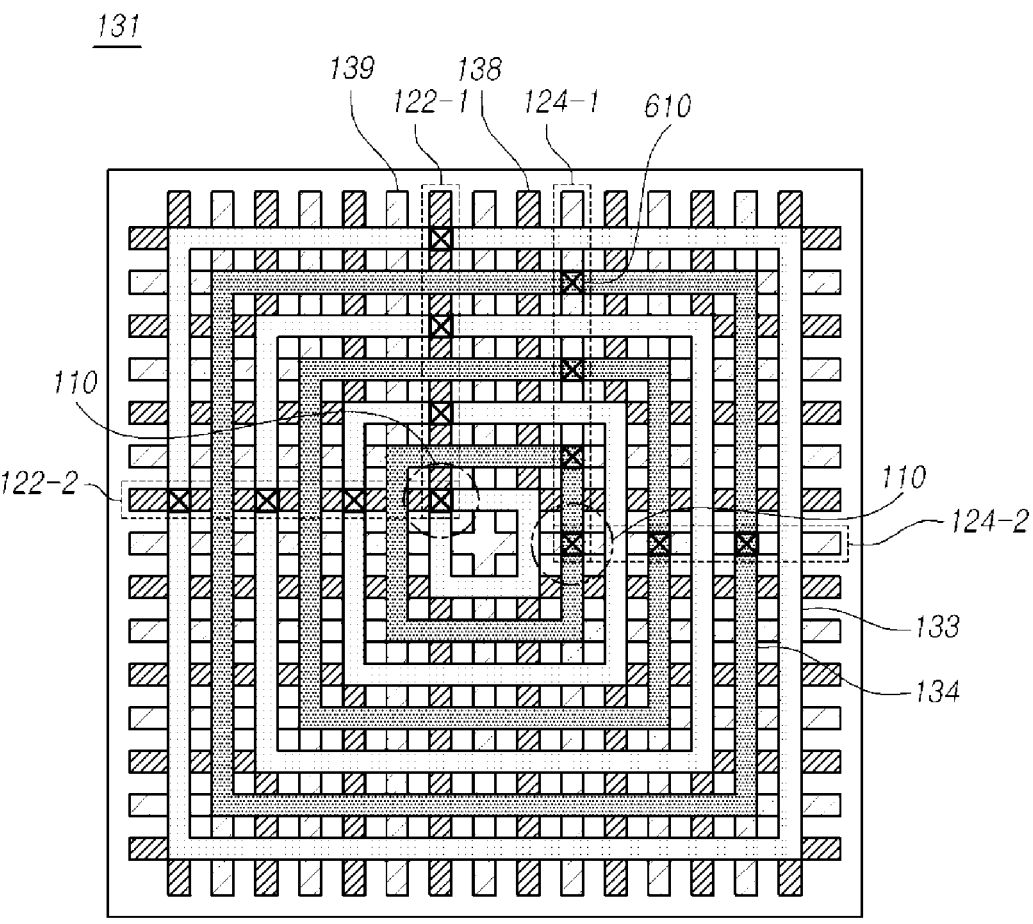
FIG. 6 is a plan view illustrating an example of power routing of a semiconductor device according to an embodiment of the disclosure.

FIG. 6 is a plan view illustrating an example of power routing of a semiconductor device according to an embodiment of the disclosure.

Referring to FIG. 6, viewed in the first direction from the first distribution layer 131, ground reference voltage lines 122 and power supply reference voltage lines 124 that are disposed in the redistribution layer 120 may form right angles to the first VSS lines 133 and the first VDD lines 134, respectively.

In an example, a ground reference voltage line 122 disposed in the redistribution layer 120 may include segments of a first ground reference voltage line 122-1 and second ground reference voltage line 122-2. The first ground reference voltage line 122-1 and the second ground reference voltage line 122-2 are coupled to the chip pads 110 to route the ground reference voltage to the first VSS lines 133 through second vias 610. Although, in FIG. 6, the first ground reference voltage line 122-1 and the second ground reference voltage line 122-2 are coupled to the same chip pad 110, in other embodiments, they may be coupled to different chip pads 110. Similarly, a power supply reference voltage lines 124 may include a first power supply reference voltage line 124-1 and a second power supply reference voltage line 124-2, and may route the power supply reference voltage to the first VDD lines 134 through second vias 610. The first power supply reference voltage line 124-1 and the second power supply reference voltage line 124-2 may be coupled to different chip pads 110.

In a comparative example, viewed in a plan view in the first direction, when the first VSS lines 133 are disposed in stripe shapes that are parallel in a transverse direction, the first ground reference voltage line 122-1 disposed in a longitudinal direction forms intersections at right angles to the plurality of first VSS lines 133 so that the insertion of the second vias 610 is facilitated. On the other hand, since the second ground reference voltage line 122-2, which is disposed in the transverse direction, is parallel to the plurality of first VSS lines 133, intersections are not formed and insertion points for second vias 610 is limited. Accordingly, the ground reference voltage may be applied bypassing through the second VSS lines 138, which are disposed in a direction perpendicular to the first VSS lines 133. In contrast, in disclosed embodiments as illustrated in FIG. 6, when the first VSS lines 133 are disposed in rectangular frame shapes, not only the first ground reference voltage line 122-1, but also the second ground reference voltage line 122-2, are at right angles to the first VSS lines 133 so that additional points for the insertion of the second vias 610 may be facilitated. Similarly, the arrangement of the first power supply reference voltage line 124-1, the second power supply reference voltage line 124-2 and the first VDD lines 134 also facilitate the selection and arrangement of second vias 610.

Accordingly, due to the structure of the first VSS lines 133 and the first VDD lines 134, the voltage lines of the redistribution layer 120 and the first conductive lines of the first distribution layer may be efficiently coupled, and the disposition flexibility of the second vias 610 may be increased. Consequently, the freedom to arrange or design the disposition of the chip pads 110 may also be increased to contribute to optimization in the aspect of designing a semiconductor package.

Figure 7:
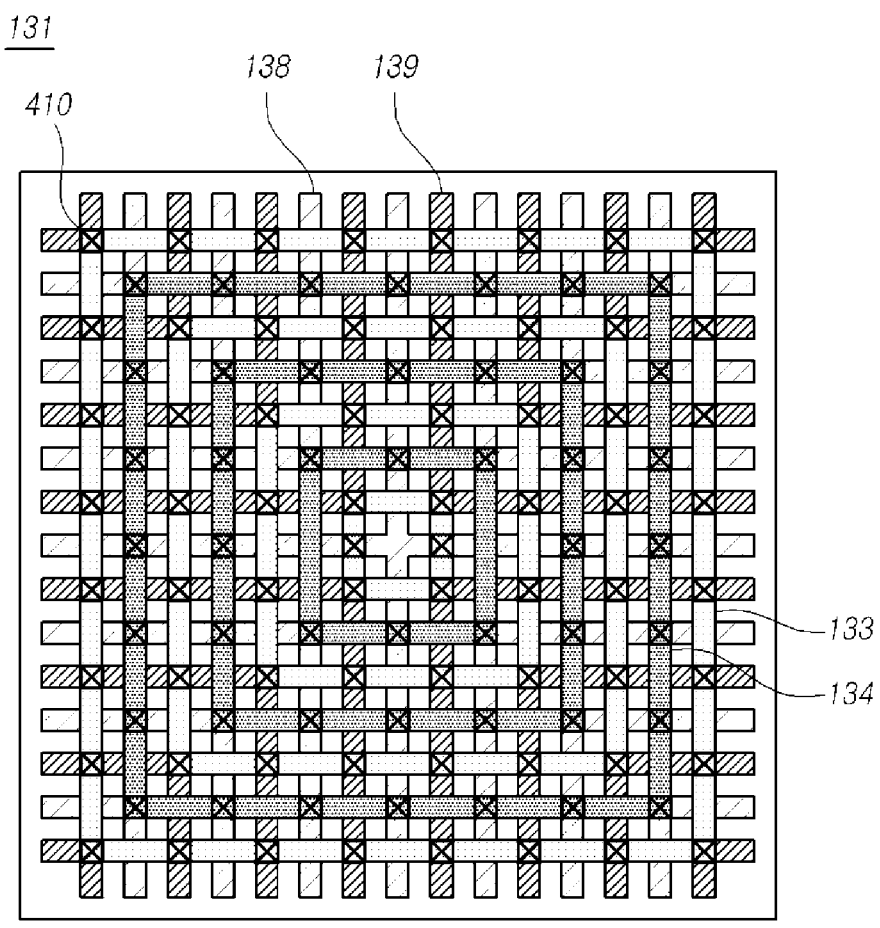
FIG. 7 is a plan view illustrating possible intersections between the first conductive lines and the second conductive lines where vias can be disposed according to the embodiments of the disclosure.

FIG. 7 is a plan view illustrating possible intersections between the first conductive lines and the second conductive lines where vias can be disposed according to the embodiments of the disclosure.

Referring to FIG. 7, first vias 410 may be formed at various positions between first VSS lines 133 and second VSS lines 138 and between the first VDD lines 134 and second VDD lines 139, respectively, where marked with 'X'.

Depending on the design of a semiconductor device 100, the first vias 410 may be formed at all of the positions marked in FIG. 7 or may be formed only at some of the positions marked in FIG. 7. In this case, the first vias 410 may be disposed such that the first VSS lines 133 and the second VSS lines 138 are directly or indirectly coupled and the first VDD lines 134 and the second VDD lines 139 are directly or indirectly coupled so that there is no isolated conductive line.

As the number of first vias 410 increases, the resistance in other components through which power is bypassed may be reduced, and voltage drops that occur in conductive lines may be improved. The first vias 410 may be disposed at appropriate positions in consideration of voltage drops and limiting factors in the formation of vias.

Figure 8:
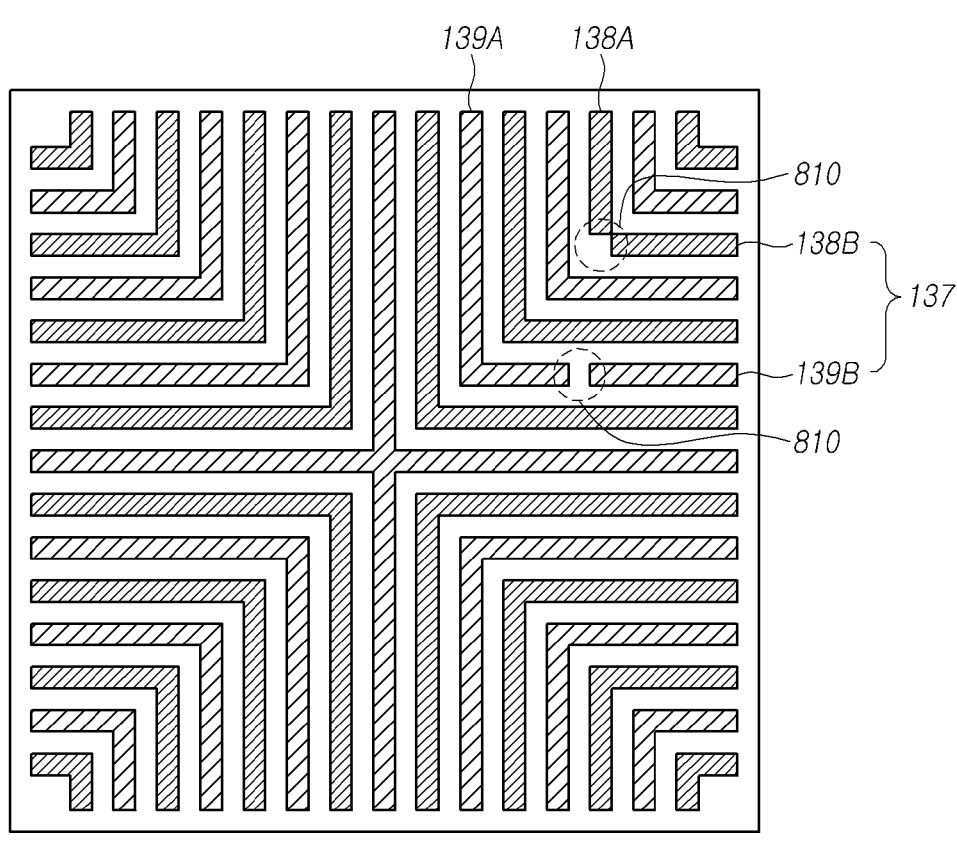
FIG. 8 is a plan view illustrating discontinuity points of conductive lines according to an embodiment of the disclosure.

FIG. 8 is a plan view illustrating discontinuity points of conductive lines according to an embodiment of the disclosure.

Referring to FIG. 8, viewed from the second distribution layer 136 in the first direction, at least one of the first conductive lines 132 (not illustrated) and the second conductive lines 137 may include a discontinuity point 810.

As described above, in the semiconductor device 100, various elements such as various transistors may be disposed in an element layer 140 according to the design of the semiconductor device 100. Coupling between an element of the element layer 140 and a chip pad 110 through which signals are inputted and outputted from among the plurality of chip pads 110 is required. A path through which a signal is transferred may pass through a region in which the first conductive lines or the second conductive lines included in the semiconductor device 100 are disposed.

The discontinuity point 810 indicates a portion of a first conductive line or a second conductive line where electrical coupling is cut off. In FIG. 8, one second VSS line 138 is divided into two portions 138A and 138B due to a discontinuity point 810, and one second VDD line 139 is similarly divided into two portions 139A and 139B.

In this case, a first portion 138A of the second VSS line 138 and a second portion 138B of the second VSS line 138 are limited in current flow by the discontinuity point 810. The first portion 138A of the second VSS line 138 and the second portion 138B of the second VSS line 138, however, may be electrically coupled to one or more first VSS lines, formed in another layer, through different first vias. As a result, even though the first portion 138A of the second VSS line 138 and the second portion 138B of the second VSS line 138 are electrically decoupled from each other by the discontinuity point 810, both portions may continue to distribute power through electrical coupling with the first VSS lines using different vias.

In a manner similar to the second VSS line 138 described above, even though a first portion 139A of the second VDD line 139 and a second portion 139B of the second VDD line 139 are decoupled from each other by the discontinuity point 810, power may be distributed through electrical coupling with the first VDD lines 134 through different first vias.

Although not illustrated in FIG. 8, a first VSS line 133 and a first VDD line 134 may also include one or more discontinuity points 810. In such instances, each divided portion of the first VSS line 133 may independently receive ground reference voltage through electrical coupling with a ground reference voltage line through different vias. Moreover, each portion of a first VSS line 133 created by discontinuity point 810 may receive ground reference voltage applied to another first VSS line 133 through the second VSS line 138. In the same manner, the power supply reference voltage may be applied to each portion of the first VDD line 134 which is divided by the discontinuity point 810, in a manner similar to the first VSS line 133, namely, through other portions of the first VDD line 134 and second VDD lines 139.

While FIG. 8 illustrates one discontinuity point 810 included in one conductive line, the disclosed technology is not limited thereto. A plurality of discontinuity points 810 may occur within a single conductive line so that the conductive line may be divided into not only a first portion and a second portion, but also a third portion, fourth portion, etc.

Figure 9:
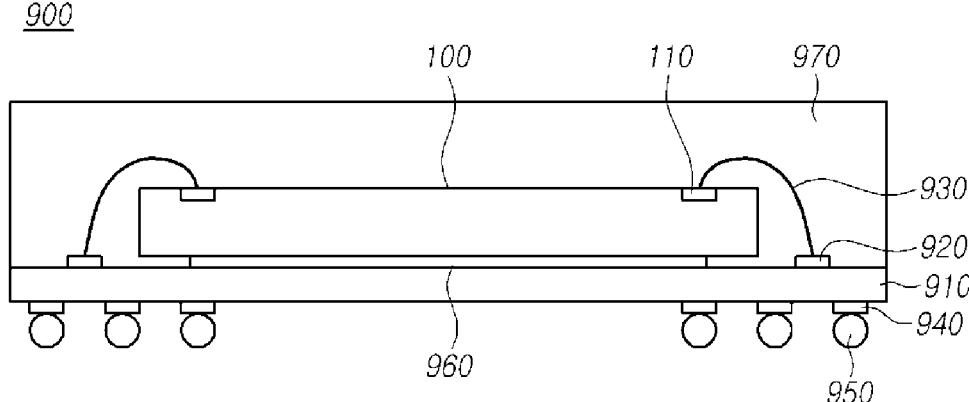
FIG. 9 is a cross-sectional view illustrating an example of a package including a semiconductor device according to an embodiment of the disclosure.

FIG. 9 is a cross-sectional view illustrating an example of a package including a semiconductor device according to an embodiment of the disclosure.

Figure 10:
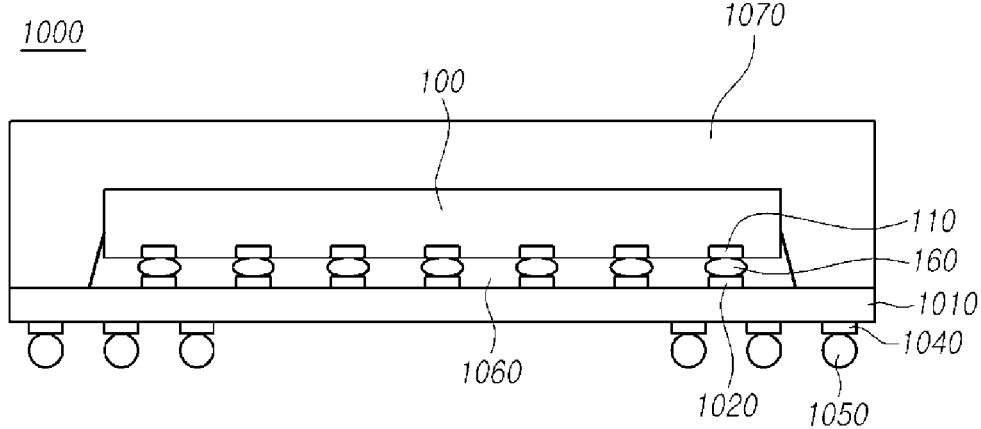
FIG. 10 is a cross-sectional view illustrating another example of a package including a semiconductor device according to an embodiment of the disclosure.

FIG. 10 is a cross-sectional view illustrating another example of a package including a semiconductor device according to an embodiment of the disclosure.

Referring to FIGS. 9 and 10, a semiconductor device may be packaged in various methods.

A semiconductor package 900 of FIG. 9 is packaged using a wire bonding method.

In FIG. 9, a semiconductor device 100 is attached onto a package substrate 910 of the semiconductor package 900 by the medium of an adhesive 960. Solder balls 950 may be disposed on solder ball pads 940 of the semiconductor package 900, and power and signals are transferred to and from the semiconductor package 900 through the solder ball pads 940 and the solder balls 950. Coupling pads 920 of the semiconductor package 900 and the chip pads 110 of the semiconductor device 100 are electrically coupled through metal wires 930. An encapsulant 970 protects the semiconductor device 100 from an external environment. In addition, the encapsulant 970 may electrically insulate the semiconductor device 100, and may effectively dissipate the heat generated in the semiconductor device 100.

The ground reference voltage and the power supply reference voltage are applied to the chip pads 110 through the solder balls 950, the solder ball pads 940, the package substrate 910, the coupling pads 920 and the metal wires 930, and are transferred to the elements of the semiconductor device 100 through the first conductive lines and the second conductive lines included in the semiconductor device 100.

A semiconductor package 1000 of FIG. 10 is packaged in a flip chip method.

A package substrate 1010, solder ball pads 1040, solder balls 1050 and an encapsulant 1070 of the semiconductor package 1000 correspond to the package substrate 910, the solder ball pads 940, the solder balls 950 and the encapsulant 970 of FIG. 9.

In the flip chip method, unlike the wire bonding method in which the semiconductor device 100 and the package substrate 910 are coupled through the metal wires 930, a semiconductor device 100 and the package substrate 1010 are coupled through chip bumps 160.

The ground reference voltage and the power supply reference voltage are applied to the chip pads 110 through the solder balls 1050, the solder ball pads 1040, the package substrate 1010, coupling pads 1020 and the chip bumps 160, and are transferred to the elements of the semiconductor device 100 through the first conductive lines and the second conductive lines included in the semiconductor device 100.

A filler 1060 may be used to fill in between the semiconductor device 100 and the package substrate 1010.

The packaging methods of FIGS. 9 and 10 are exemplary and for illustration purposes only, and the semiconductor device 100 may be packaged in various packaging methods.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A semiconductor device comprising:
a plurality of chip pads to which voltage is applied;
a first distribution layer in which a plurality of first conductive lines, each arranged as a rectangular frame of a different size, are disposed;
a second distribution layer in which a plurality of second conductive lines including a central cross-shaped conductive line and L-shaped conductive lines open toward respective corners of the second distribution layer are disposed; and
a redistribution layer electrically coupling the plurality of chip pads and the first conductive lines,
wherein the plurality of first conductive lines are divided into first ground reference voltage (first VSS) lines that are electrically coupled to one or more ground reference voltage lines in the redistribution layer through vias, and first power supply reference voltage (first VDD) lines that are electrically coupled to one or more power supply reference voltage lines in the redistribution layer through vias, and the first VSS lines and the first VDD lines are alternately disposed,
the plurality of second conductive lines are divided into second VSS lines that are coupled to the first VSS lines through vias and second VDD lines that are coupled to the first VDD lines through vias, and the second VSS lines and the second VDD lines are alternately disposed with each other,
wherein vias are formed at all or some of intersections between the first VSS lines and the second VSS lines, and at all or some of intersections of the first VDD lines and the second VDD lines, and
wherein the plurality of chip pads are disposed centrally on a plane in a matrix format, and vias are electrically connected to the plurality of chip pads.

2. The semiconductor device according to claim 1, wherein the first conductive lines and the second conductive lines form right angle intersections to each other in a plan view.

3. The semiconductor device according to claim 1, wherein a ground reference voltage is applied to a set of the plurality of chip pads and a power supply reference voltage is applied to an other set of the plurality of chip pads, and the redistribution layer includes one or more ground reference voltage lines that are electrically coupled to the set of the plurality of chip pads and one or more power supply reference voltage lines that are electrically coupled to the other set of the plurality of chip pads.

4. The semiconductor device according to claim 1, wherein at least one of the first conductive lines and the second conductive lines includes a discontinuity point.

5. A power distribution network comprising:

a plurality of first conductive lines disposed in a first layer, and having rectangular shapes of different sizes, respectively; and a plurality of second conductive lines disposed in a second layer different from the first layer, and including a central cross-shaped conductive line and L-shaped conductive lines open toward respective corners of the second layer, wherein the plurality of first conductive lines are divided into first ground reference voltage (first VSS) lines that are electrically coupled to one or more ground reference voltage lines in a redistribution layer through vias, and first power supply reference voltage (first VDD) lines that are electrically coupled to one or more power supply reference voltage lines in the redistribution layer through vias, and the first VSS lines and the first VDD lines are alternately disposed, the plurality of second conductive lines are divided into second VSS lines that are coupled to the first VSS lines through vias and second VDD lines that are coupled to the first VDD lines through vias, and the second VSS lines and the second VDD lines are alternately disposed with each other, wherein vias are formed at all or some of intersections between the first VSS lines and the second VSS lines, and at all or some of intersections of the first VDD lines and the second VDD lines, and wherein vias are electrically connected to a plurality of chip pads disposed centrally on a plane of a semiconductor device in a matrix format.

6. The power distribution network according to claim 5, wherein the plurality of first conductive lines and the plurality of second conductive lines intersect with each other at right angles from a plan view.

7. The power distribution network according to claim 5, wherein at least one of the first conductive lines and the second conductive lines includes a discontinuity point.

* * * * *